(12) United States Patent
Bai et al.

(10) Patent No.: US 11,749,585 B2
(45) Date of Patent: Sep. 5, 2023

(54) HIGH THERMAL CONDUCTIVITY, HIGH MODULUS STRUCTURE WITHIN A MOLD MATERIAL LAYER OF AN INTEGRATED CIRCUIT PACKAGE

(71) Applicant: Intel Corporation, Santa Clara, CA (US)

(72) Inventors: Yiqun Bai, Chandler, AZ (US); Vipul Mehta, Chandler, AZ (US); John Decker, Tempe, AZ (US); Ziyin Lin, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 676 days.

(21) Appl. No.: 16/805,392

(22) Filed: Feb. 28, 2020

(65) Prior Publication Data

US 2021/0272878 A1    Sep. 2, 2021

(51) Int. Cl.
| | |
|---|---|
| *H01L 23/31* | (2006.01) |
| *H01L 23/433* | (2006.01) |
| *H01L 21/56* | (2006.01) |
| *H01L 25/00* | (2006.01) |
| *H01L 25/065* | (2023.01) |

(52) U.S. Cl.
CPC .......... *H01L 23/4334* (2013.01); *H01L 21/56* (2013.01); *H01L 23/3185* (2013.01); *H01L 25/0655* (2013.01); *H01L 25/50* (2013.01)

(58) Field of Classification Search
CPC .................................................. H01L 23/4334
See application file for complete search history.

(56) References Cited

U.S. PATENT DOCUMENTS

| | | | |
|---|---|---|---|
| 2017/0203551 A1* | 7/2017 | Davis | B32B 27/286 |
| 2018/0351056 A1* | 12/2018 | Huang | H01L 33/504 |
| 2022/0011815 A1* | 1/2022 | Min | G06F 1/1652 |
| 2022/0189862 A1* | 6/2022 | Chou | H01L 21/4857 |
| 2023/0040833 A1* | 2/2023 | Park | H10K 59/40 |

* cited by examiner

*Primary Examiner* — Thao P Le
(74) *Attorney, Agent, or Firm* — Essential Patents Group, LLP (57) ABSTRACT

An integrated circuit assembly may be formed comprising an electronic substrate, at least one integrated circuit device electrically attached to the electronic substrate, a mold material layer abutting electronic substrate and substantially surrounding the at least one integrated circuit, and at least one structure within the mold material layer, wherein the at least one structure comprises a material having a modulus of greater than about 20 gigapascals and a thermal conductivity of greater than about 10 watts per meter-Kelvin.

20 Claims, 7 Drawing Sheets

HIGH THERMAL CONDUCTIVITY, HIGH MODULUS STRUCTURE WITHIN A MOLD MATERIAL LAYER OF AN INTEGRATED CIRCUIT PACKAGE

TECHNICAL FIELD

Embodiments of the present description generally relate to the field of the fabrication of molded integrated circuit packages, and, more specifically, to the incorporation of high modulus, high thermal conductivity structures into a mold material layer of an integrated circuit package.

BACKGROUND

The integrated circuit industry is continually striving to produce ever faster, smaller, and thinner integrated circuit (IC) devices and packages for use in various electronic products, including, but not limited to, computer servers and portable products, such as portable computers, electronic tablets, cellular phones, digital cameras, and the like.

One pathway to achieving these goals is the tighter packaging of integrated circuit devices. One such arrangement, known as a stacked composite die, comprises a plurality of integrated circuit devices attached to an electronic substrate, either passive or active, with a mold material layer on the electronic substrate that substantially surrounds or encircles the plurality of integrated circuit devices. Although such an integrated circuit package may be an effective way of packaging integrated circuit devices, it has a higher warpage than monolithic silicon, because the mold material layer causes temperature gradients, as will be understood to those skilled in the art. Such warpage can cause delamination and/or cracking of the mold material layer, which can result in the failure of the integrated circuit package. The warpage from the temperature gradients may occur during temperature cycles from the operation of the integrated circuit package and/or from manufacturing processes, such as from thermal compression bonding of the integrated circuit package to a board.

Furthermore, when the substrate is active, e.g. an integrated circuit device, it can generate considerable heat, which may be difficult to transfer through the mold material layer and the plurality of integrated circuit devices to a heat dissipation device. This issue can be mitigated through the use of a thermally conductive mold material to from the mold material layer. However, thermally conductive mold materials generally have high coefficients of thermal expansion, which can exacerbate warpage.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bond interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include an integrated circuit package, and methods of making the same, comprising an electronic substrate, at least one integrated circuit device electrically attached to the electronic substrate, a mold material layer abutting electronic substrate and substantially surrounding the at least one integrated circuit device, and at least one structure within the mold material layer, wherein the at least one structure comprises a material having a high modulus and a high thermal conductivity.

Figure 1:
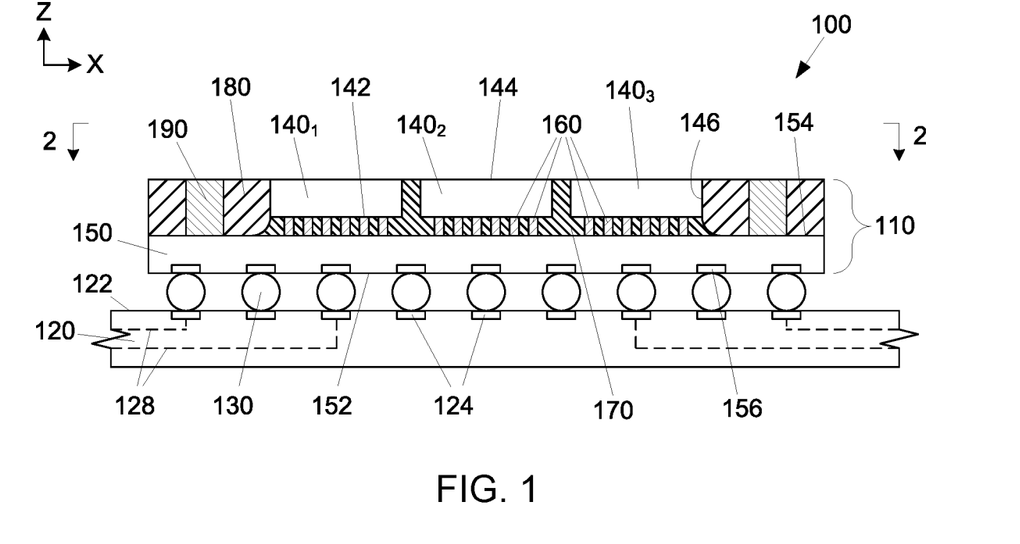
FIG. 1 is a side cross-sectional view of an integrated circuit assembly, according to one embodiment of the present description.

FIG. 1 illustrates an integrated circuit assembly 100 having an integrated circuit package 110 electrically connected to an electronic board 120. The integrated circuit package 110 may comprise at least one integrated circuit device (illustrated as a first integrated circuit device 140₁, a second integrated circuit device 140₂, and a third integrated circuit device 140₃) electrically attached to an electronic substrate 150 in a configuration generally known as a flip-chip or controlled collapse chip connection ("C4") configuration, according to an embodiment of the present description.

The first integrated circuit device 140₁, the second integrated circuit device 140₂, and the third integrated circuit device 140₃ may be any appropriate device, including, but not limited to, a microprocessor, a chipset, a graphics device, a wireless device, a memory device, an application specific integrated circuit, combinations thereof, stacks thereof, or the like. As shown, the first integrated circuit device 1401, the second integrated circuit device 1402, and the third integrated circuit device 1403 may each have a first surface 142, an opposing second surface 144, and at least one side 146 extending between the first surface 142 and the second surface 144.

In an embodiment of the present description shown in FIG. 1, the first integrated circuit device 1401, the second integrated circuit device 1402, and the third integrated circuit device 1403 may be electrically attached to the electronic substrate 150 with a plurality of device-to-substrate interconnects 160. The device-to-substrate interconnects 160 may be any appropriate electrically conductive material or structure, including, but not limited to, solder balls, metal bumps or pillars, metal filled epoxies, or a combination thereof. In one embodiment, the device-to-substrate interconnects 160 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 160 may be copper bumps or pillars. In a further embodiment, the device-to-substrate interconnects 160 may be metal bumps or pillars coated with a solder material. The device-to-substrate interconnects 160 may be in electrical communication with integrated circuitry (not shown) within their respective integrated circuit devices, i.e. the first integrated circuit device 1401, the second integrated circuit device 1402, and the third integrated circuit device 1403.

An electrically-insulating underfill material 170, such as an epoxy material, may be disposed between the first integrated circuit device 1401 and the electronic substrate 150, between the second integrated circuit device 1402 and the electronic substrate 150, and between the third integrated circuit device 1403 and the electronic substrate 150. As will be understood to those skilled in the art, the underfill material 170 may be dispensed between the first surface 142 of the integrated circuit devices 1401, 1402, 1403, respectively, and the electronic substrate 150 as a viscous liquid and then hardened with a curing process. The underfill material 170 may also be a molded underfill material, as known in the art. The underfill material 170 may provide structural integrity and may prevent contamination, as will be understood to those skilled in the art.

The electronic substrate 150 may be any appropriate device, including a passive device, such as an interposer, a circuit board, and the like, and/or an active device (e.g. having integrated circuitry), such as, a microprocessor, a chipset, a graphics device, a wireless device, a memory device, an application specific integrated circuit, combinations thereof, stacks thereof, or the like. As shown, the electronic substrate 150 may include a first surface 152 and an opposing second surface 154.

When the electronic substrate 150 is a passive device, it may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. The electronic substrate 150 may further include conductive routes or "metallization" (not shown) extending through the electronic substrate 150. As will be understood to those skilled in the art, the conductive routes may be a combination of conductive traces (not shown) and conductive vias (not shown) extending through the plurality of dielectric material layers (not shown). These conductive traces and conductive vias are well known in the art and are not shown in FIG. 1 for purposes of clarity. The conductive traces and the conductive vias may be made of any appropriate conductive material, including but not limited to, metals, such as copper, silver, nickel, gold, aluminum, alloys thereof, and the like. As will be understood to those skilled in the art, the electronic substrate 150 may be a cored substrate or a coreless substrate.

When the electronic substrate 150 is an active device, it may be any appropriate device, including, but not limited to, a microprocessor, a chipset, a graphics device, a wireless device, a memory device, an application specific integrated circuit, combinations thereof, stacks thereof, or the like. The first integrated circuit device 1401, the second integrated circuit device 1402, and the third integrated circuit device 1403 may be electrically attached to through-silicon vias (not shown) on the second surface 154 of the electronic substrate 150 (as an active device). Through-silicon vias are known in the art and for purposes of clarity and conciseness will be discussed or illustrated herein.

The electronic board 120 may be a passive device and, like the passive electronic substrate 150 previously discussed, may be comprised of a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. The electronic board 120 may further include conductive routes or "metallization" 128 (shown in dashed lines) extending through the electronic board 120. As will be understood to those skilled in the art, the conductive routes 128 may be a combination of conductive traces (not shown) and conductive vias (not shown) extending through the plurality of dielectric material layers (not shown). These conductive traces and conductive vias are well known in the art and are not shown in FIG. 1 for purposes of clarity. The conductive traces and the conductive vias may be made of any appropriate conductive material, including but not limited to, metals, such as copper, silver, nickel, gold, and aluminum, alloys thereof, and the like. As will be understood to those skilled in the art, the electronic board 120 may be a cored substrate or a coreless substrate.

In an embodiment of the present description, the integrated circuit package 110 may be electrically attached to the electronic board 120 with a plurality of package-to-board interconnects 130. In one embodiment of the present description, the package-to-board interconnects 130 may extend between bond pads 156 on the first surface 152 of the electronic substrate 150 and bond pads 124 on a first surface 122 of the electronic board 120. The package-to-board interconnects 130 may be any appropriate electrically conductive material or structure, including, but not limited to, solder balls, metal bumps or pillars, metal filled epoxies, or a combination thereof. In one embodiment, the package-toboard interconnects 130 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the package-to-board interconnects 130 may be copper bumps or pillars. In a further embodiment, the package-to-board interconnects 130 may be metal bumps or pillars coated with a solder material.

The bond pads 124 on the first surface 122 of the electronic board 120 may be in electrical contact with the conductive routes 128. The conductive routes 128 may extend through the electronic board 120 and be electrically connected to external components (not shown).

As further shown in FIG. 1, a mold material layer 180 may be formed on the electronic substrate 150. The mold material layer 180 may be any appropriate material, such as an epoxy resin. The mold material layer 180 may provide structural integrity and may prevent contamination, as will be understood to those skilled in the art. At least one high thermal conductive, high modulus structure 190 may be formed within the mold material layer 180. The at least one structure 190 may be made from any appropriate high modulus and high thermal conductivity material, including, but not limited to, metal, graphene, sintering paste, and like. In one embodiment, the metal material may include copper, silver, nickel, gold, aluminum, alloys thereof, and the like. In another embodiment, the graphene material may include aligned graphene, functionalize graphene, sheet graphene, and the like. In still another embodiment, the fully or partially sintering paste may include silver, silver coated copper particles, copper/tin intermetallic compound, tin/antimony alloy in epoxy or silicone matrix, and the like. In one embodiment, the at least one structure 190 may comprise a material having a modulus of greater than about 20 gigapascals and a thermal conductivity of greater than about 10 watts per meter-Kelvin.

Figure 2:
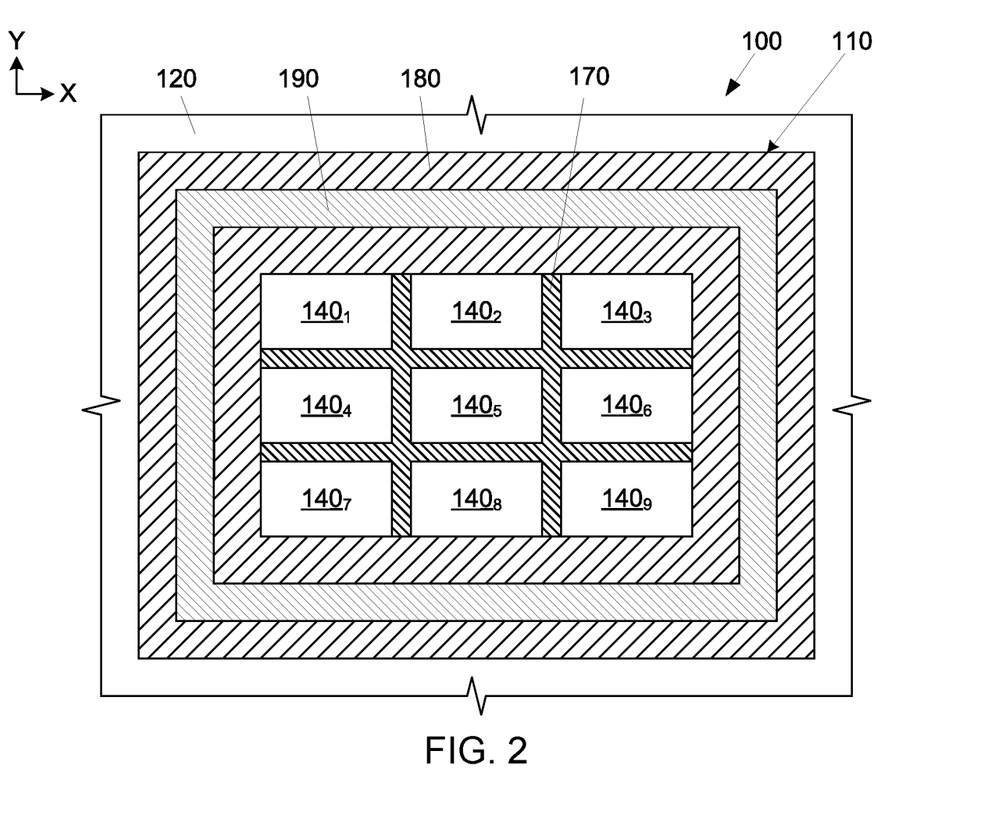
FIGS. 2-4 are plan views of the integrated circuit assembly along line 2-2 of FIG. 1, according to embodiments of the present description.
Figure 3:
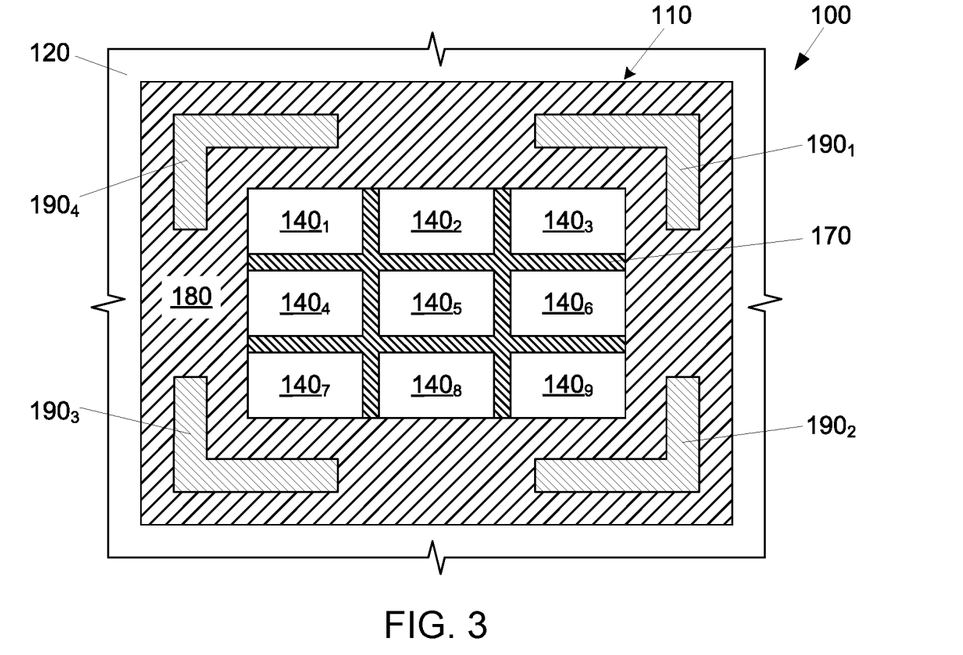
Figure 4:
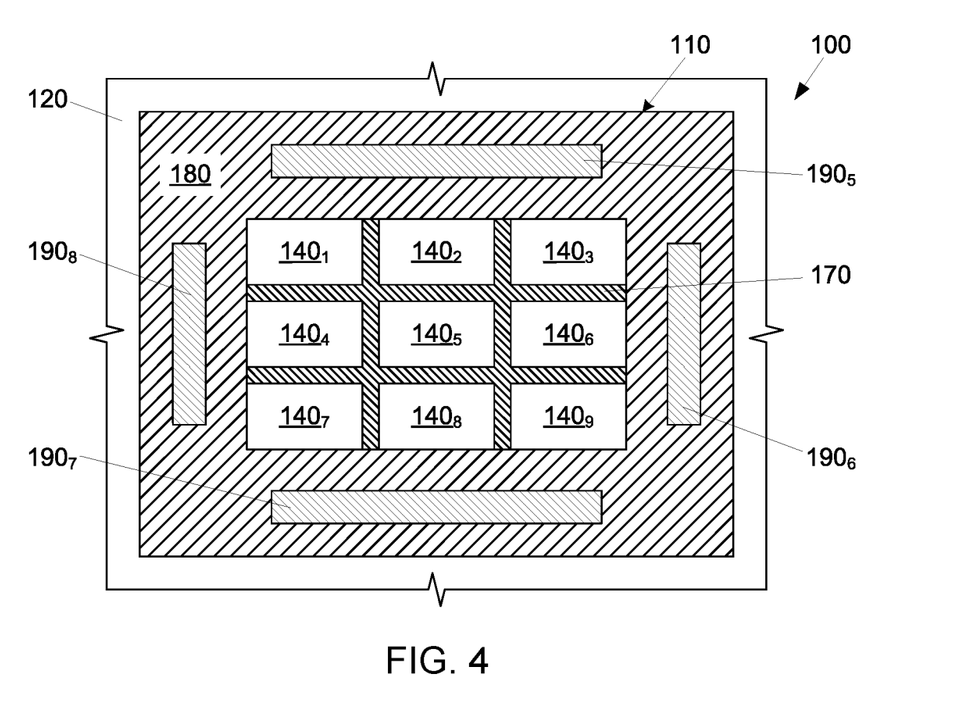

Although three integrated circuit devices 140₁, 140₂, and 140₃ are shown in FIG. 1, the integrated circuit package 110 may have any appropriate number of integrated circuit devices, such as integrated circuit devices 140₁-140₉ shown in FIG. 2. Furthermore, the at least one structure 190 may have any appropriate configuration. In one embodiment of the present description, as shown in FIG. 2, the at least one structure 190 may a single structure surrounding the integrated circuit devices 140₁-140₉, such that it resembles a frame for a picture, e.g. a "picture frame". In another embodiment of the present description, the at least one structure 190 may composes a plurality of segments, such as L-shaped walls 190₁-190₄ shown in FIG. 3, wall segments 190₅-190₈ shown in FIG. 4, and the like.

Figure 5:
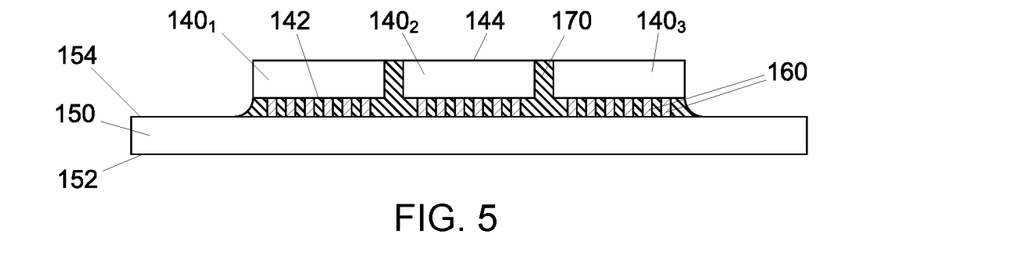
FIGS. 5-8 are cross-sectional views of a method of fabricating an integrated circuit assembly, according to an embodiment of the present description.
Figure 6:
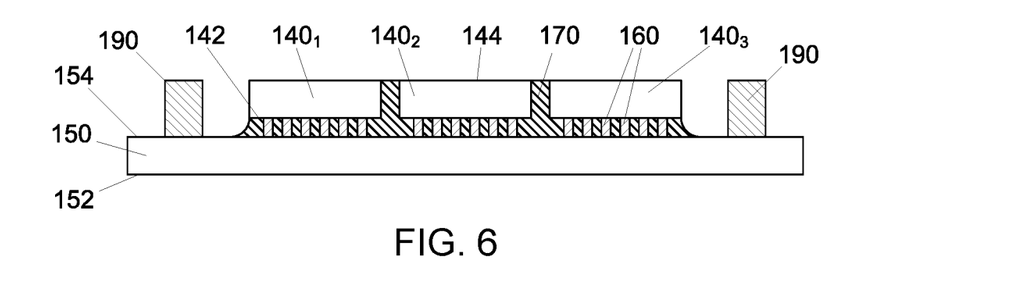
Figure 7:
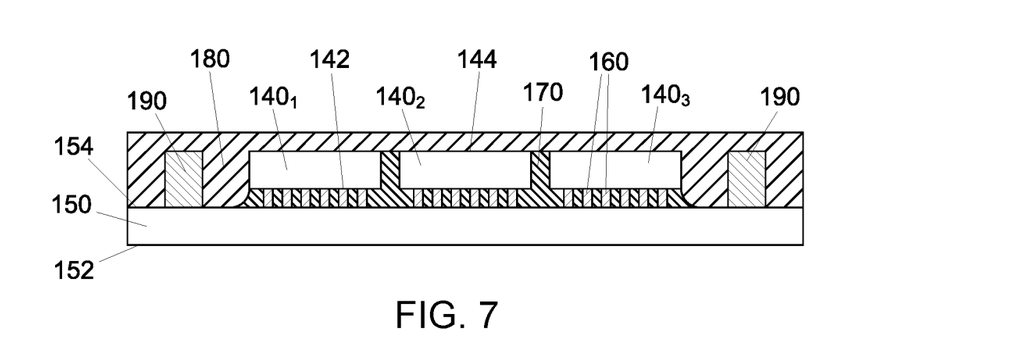
Figure 8:
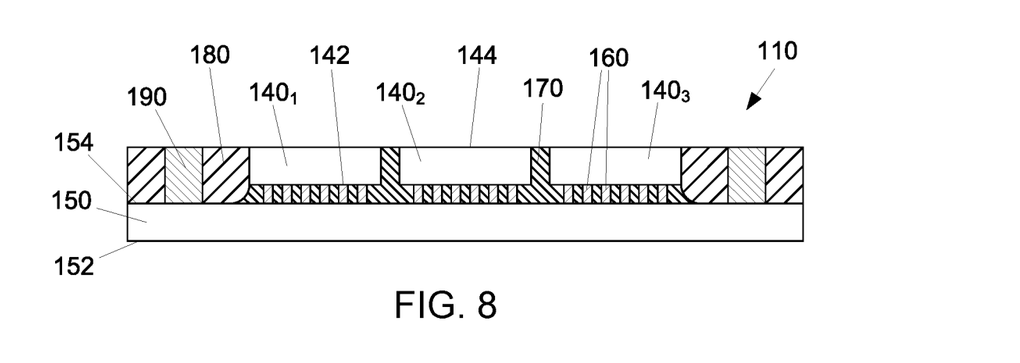

FIGS. 5-8 illustrate a process of fabricating an integrated circuit package 110, according to one embodiment of the present description. As shown in FIG. 5, at least one integrated circuit device 140₁-140₃ may be electrically attached to the electronic substrate 150 through the plurality of device-to-substrate interconnects 160 and the underfill material 170 may be disposed between the integrated circuit devices 140₁-140₃ and the electronic substrate 150. As shown in FIG. 6, the at least one structure 190 may be formed on the electronic substrate 150. The at least one structure 190 may be formed by any process known in the art, including, but not limited to, plating, dispensing, printing, and the like. As shown in FIG. 7, the mold material layer 180 may be formed over the electronic substrate 150, the at least one structure 190, and the integrated circuit devices 140₁-140₃. The mold material layer 180 may be formed by dispensing, lamination, use of a mold chase, and the like. The mold material layer 180 may be planarized, such as by chemical-mechanical polishing ("CMP"), to expose at portion of the at least one structure 190 and the second surfaces 144 of the integrated circuit devices 140₁-140₃, thereby forming the integrated circuit package 110, as shown in FIG. 8.

Figure 9:
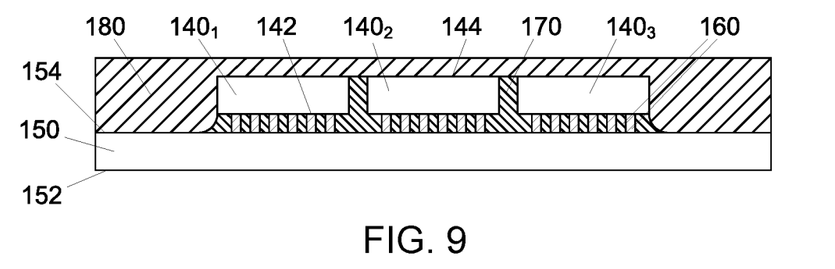
FIGS. 9-12 are cross-sectional views of another method of fabricating an integrated circuit assembly, according to one embodiment of the present description.
Figure 10:
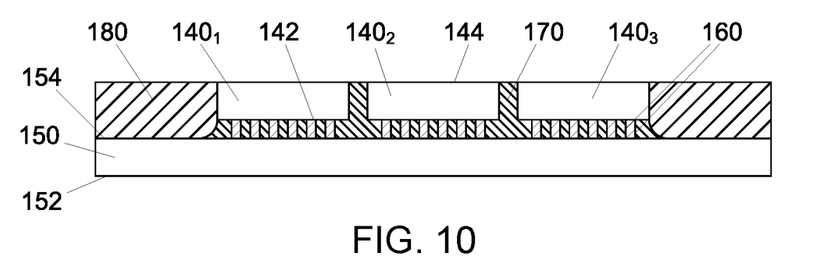
Figure 11:
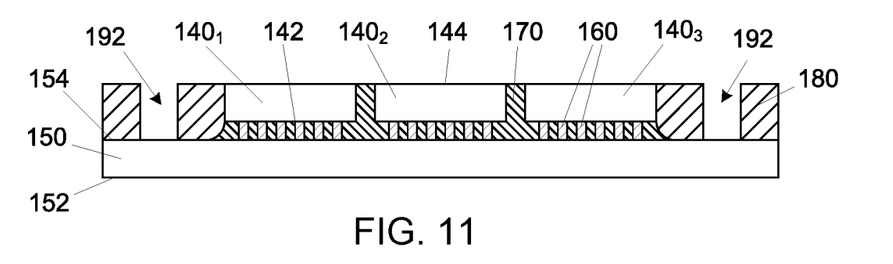
Figure 12:
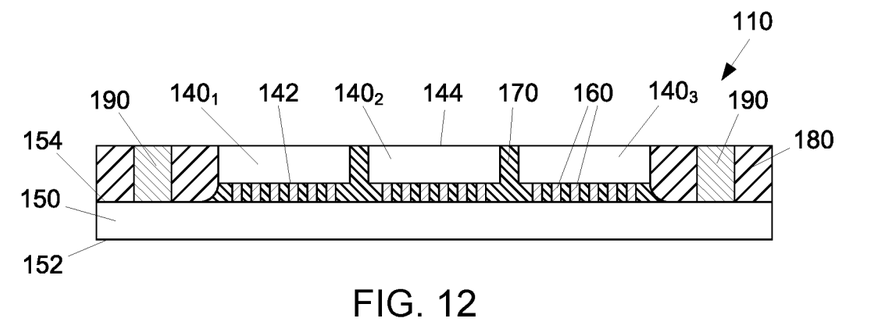

FIGS. 9-12 illustrate a process of fabricating an integrated circuit package 110, according to one embodiment of the present description. Beginning with the structure illustrated and discussed with regard to FIG. 5, the mold material layer 180 may be formed over the electronic substrate 150 and the integrated circuit devices 140₁-140₃, as shown in FIG. 9. As shown in FIG. 10, the mold material layer 180 may be planarized, as previously discussed, to expose the second surfaces 144 of the integrated circuit devices 140₁-140₃. As shown in FIG. 11, at least one trench 192 may be formed through the mold material layer 180 to expose a portion of the electronic substrate 150. The at least one trench 192 may be formed by any appropriate process known in the art, including, but not limited to, laser drilling, ion ablation, etching, and the like. As shown in FIG. 12, at least one structure 190 may be formed on the electronic substrate 150 within the at least one trench 192 (see FIG. 11) to form the integrated circuit package 110. The at least one structure 190 may be formed by any process known in the art, including, but not limited to, plating, dispensing, printing, and the like.

It is understood that the embodiments are not limited to the integrated circuit assembly 100 of FIG. 1, but may be any appropriate configuration. In one embodiment shown in FIG. 13, the integrated circuit assembly 100 may include a motherboard 194, wherein the electronic board 120 is electrically attached to the motherboard 194. The motherboard 194 may be a passive device and, like the passive electronic board 120 previously discussed, may be comprised of a plurality of dielectric material layers (not shown) and conductive routes or "metallization" 198 (shown in dashed lines) extending through the motherboard 194. As will be understood to those skilled in the art, the conductive routes 198 may be a combination of conductive traces (not shown) and conductive vias (not shown) extending through the plurality of dielectric material layers (not shown). These conductive traces and conductive vias are well known in the art and are not shown in FIG. 13 for purposes of clarity. As will be understood to those skilled in the art, the motherboard 194 may be a cored substrate or a coreless substrate.

Figure 13:
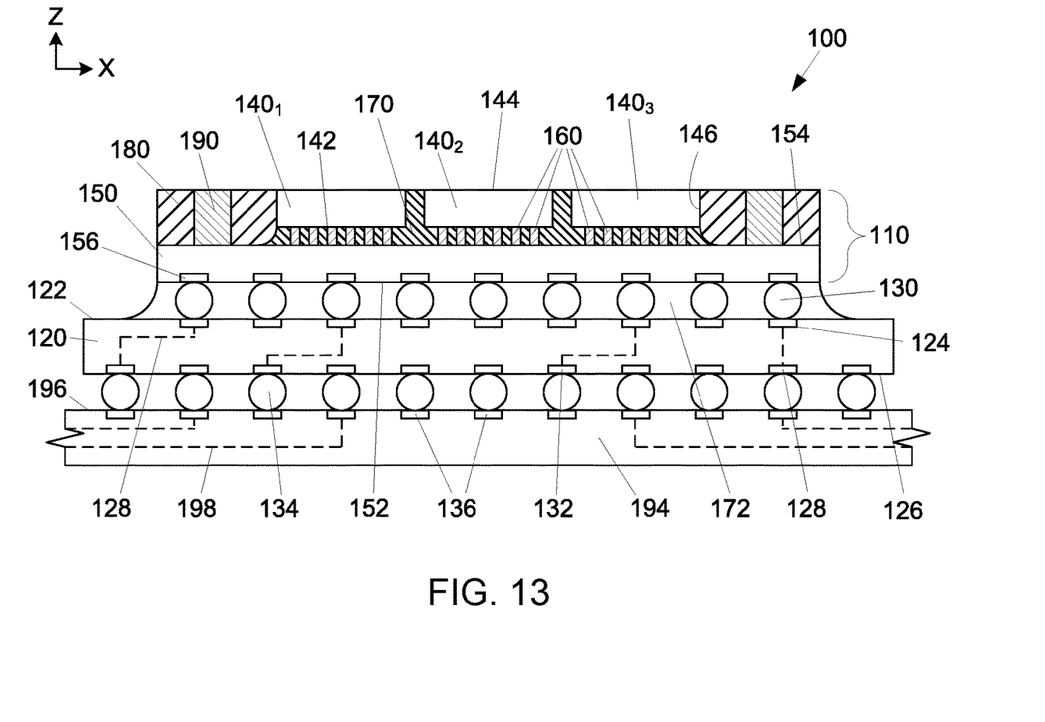
FIG. 13 is a side cross-sectional view of an integrated circuit assembly, according to another embodiment of the present description.

In an embodiment of the present description, the electronic board 120 may be electrically attached to the motherboard 194 with a plurality of board-to-board interconnects 134. In one embodiment of the present description, the board-to-board interconnects 134 may extend between bond pads 132 on a second surface 126 of the electronic substrate 120 and bond pads 136 on a first surface 196 of the motherboard 194. The board-to-board interconnects 134 may be of similar construction and composition as the previously discussed package-to-board interconnects 130.

As further shown in FIG. 13, an underfill material 172 may be disposed between the integrated circuit package 110 and the electronic board 120. Additionally, the bond pads 136 on the first surface 196 of the motherboard 194 may be in electrical contact with the conductive routes 198. The conductive routes 198 may extend through the motherboard 194 and be electrically connected to external components (not shown).

Figure 14:
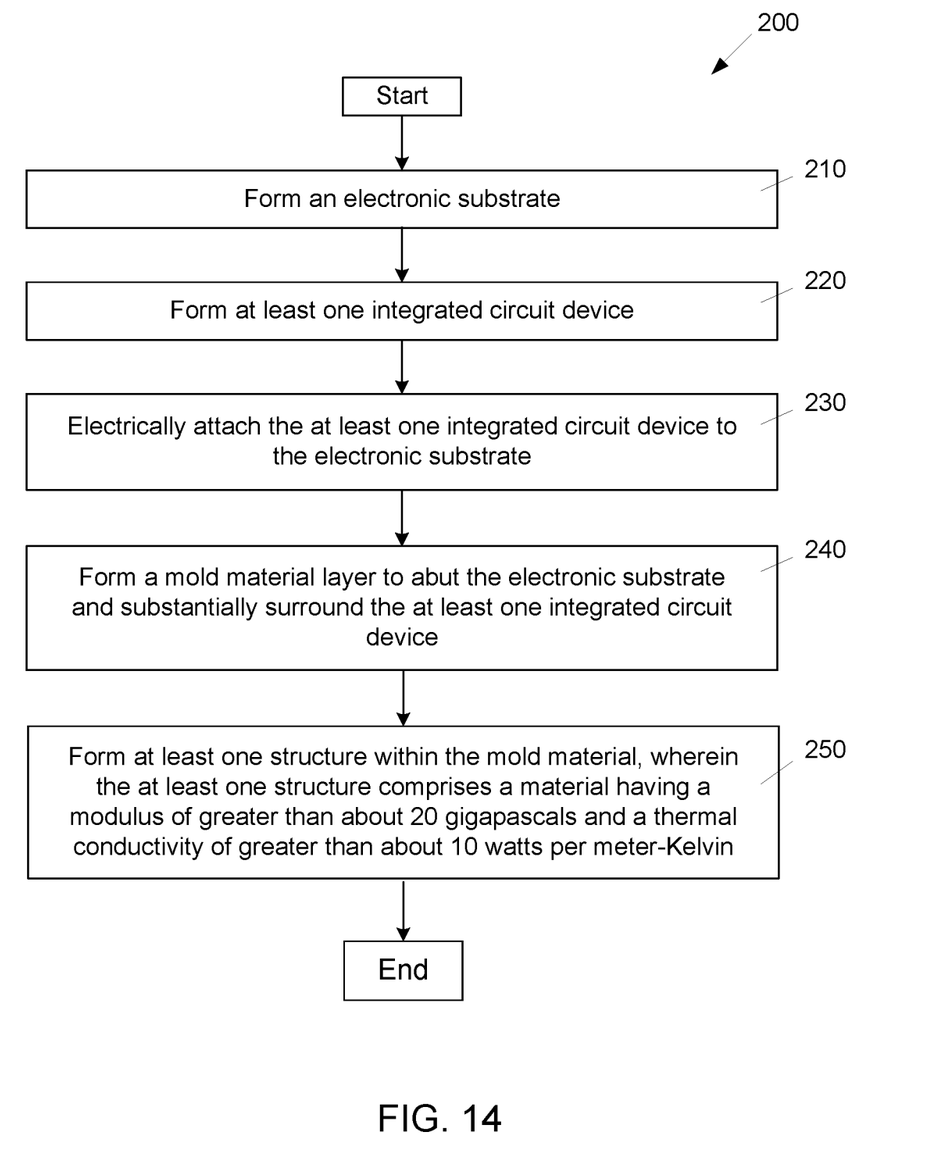
FIG. 14 is a flow chart of a process of fabricating an integrated circuit assembly, according to an embodiment of the present description.

FIG. 14 is a flow chart of a process 200 of fabricating an integrated circuit assembly according to an embodiment of the present description. As set forth in block 210, an electronic substrate may be formed. At least one integrated circuit device may be formed, as set forth in block 220. As set forth in block 230, the at least one integrated circuit device may be electrically attached to the electronic substrate. A mold material layer may be formed to abut the electronic substrate and to substantially surround the at least one integrated circuit device, as set forth in block 240. As set forth in block 250, at least one structure may be formed within the mold material layer, wherein the at least one structure comprises a material having modulus of greater than about 20 gigapascals and a thermal conductivity of greater than about 10 watts per meter-Kelvin.

Figure 15:
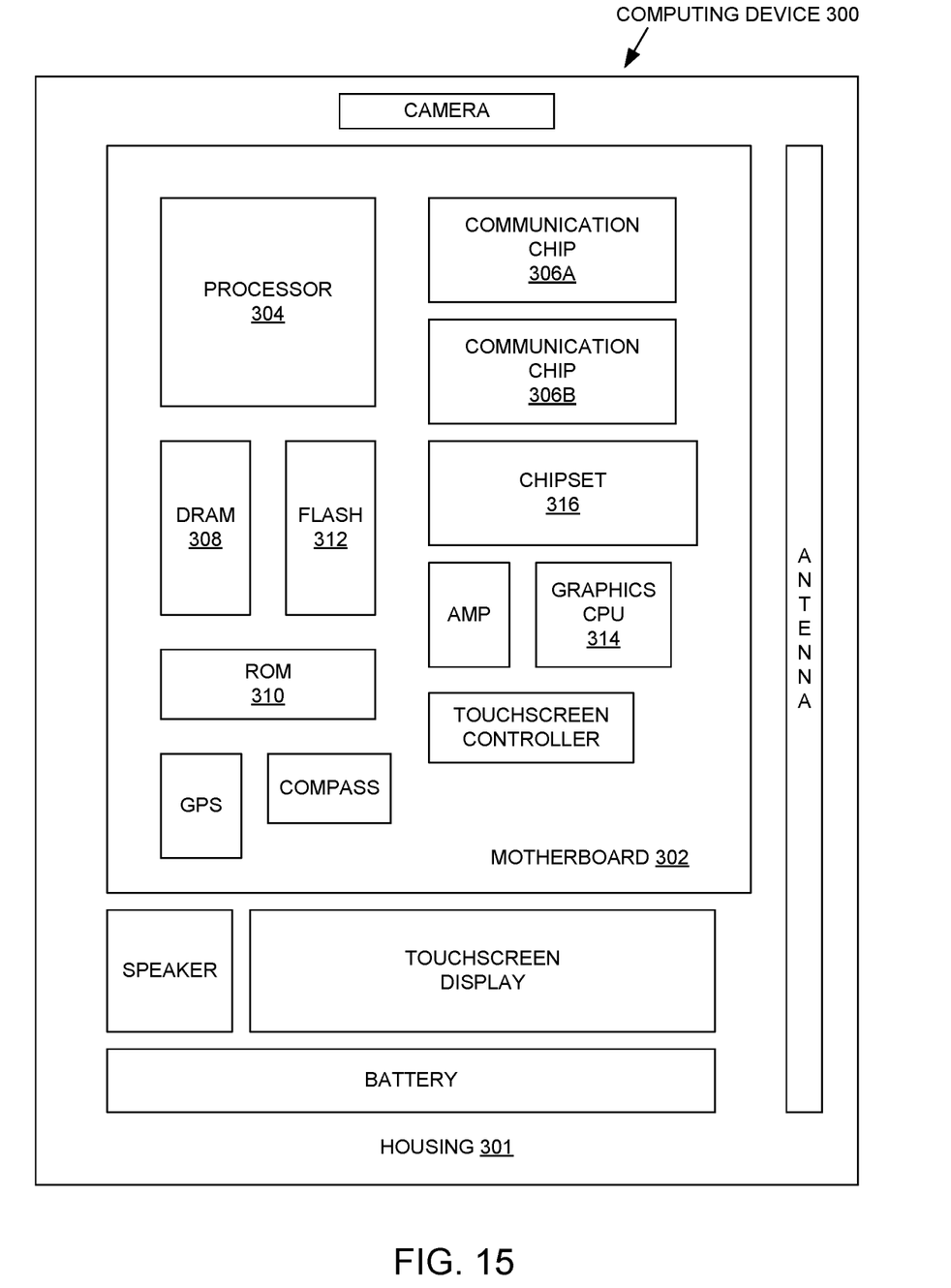
FIG. 15 is an electronic system, according to one embodiment of the present description.

FIG. 15 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit assembly comprising an electronic substrate, at least one integrated circuit device electrically attached to the electronic substrate, a mold material layer abutting electronic substrate and substantially surrounding the at least one integrated circuit device; and at least one structure within the mold material layer, wherein the at least one structure comprises a material having a modulus of greater than about 20 gigapascals and a thermal conductivity of greater than about 10 watts per meter-Kelvin.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-15. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an integrated circuit assembly, comprising an electronic substrate, at least one integrated circuit device electrically attached to the electronic substrate, a mold material layer abutting the electronic substrate and substantially surrounding the at least one integrated circuit device, and at least one structure within the mold material layer, wherein the at least one structure comprises a material having a modulus of greater than about 20 gigapascals and a thermal conductivity of greater than about 10 watts per meter-Kelvin.

In Example 2, the subject matter of Example 1 can optionally include the material of the at least one structure being selected from the group consisting of metal, graphene, and sintering paste.

In Example 3, the subject matter of any of Examples 1 to 2 can optionally include the electronic substrate being an active device.

In Example 4, the subject matter of any of Examples 1 to 2 can optionally include the electronic substrate being a passive device.

In Example 5, the subject matter of any of Examples 1 to 4 can optionally include the least one structure substantially surrounding the at least one integrated circuit device.

Example 6 is an electronic system, comprising a board and an integrated circuit assembly electrically attached to the board, wherein the integrated circuit assembly comprises an electronic substrate, at least one integrated circuit device electrically attached to the electronic substrate, a mold material layer abutting the electronic substrate and substantially surrounding the at least one integrated circuit device, and at least one structure within the mold material layer, wherein the at least one structure comprises a material having a modulus of greater than about 20 gigapascals and a thermal conductivity of greater than about 10 watts per meter-Kelvin.

In Example 7, the subject matter of Example 6 can optionally include the material of the at least one structure being selected from the group consisting of metal, graphene, and sintering paste.

In Example 8, the subject matter of any of Examples 6 to 7 can optionally include the electronic substrate being an active device.

In Example 9, the subject matter of any of Examples 6 to 7 can optionally include the electronic substrate being a passive device.

In Example 10, the subject matter of any of Examples 6 to 9 can optionally include the least one structure substantially surrounding the at least one integrated circuit device.

Example 11 is a method of fabricating an integrated circuit assembly, comprising forming an electronic substrate, forming at least one integrated circuit device, electrically attaching the at least one integrated circuit device to the electronic substrate, forming a mold material layer to abut the electronic substrate and substantially surrounding the at least one integrated circuit device, and forming at least one structure within the mold material layer, wherein the at least one structure comprises a material having a modulus of greater than about 20 gigapascals and a thermal conductivity of greater than about 10 watts per meter-Kelvin.

In Example 12, the subject matter of Example 11 can optionally include the electronic substrate being an active device.

In Example 13, the subject matter of Example 11 can optionally include the electronic substrate being a passive device.

In Example 14, the subject matter of any of Examples 11 to 13 can optionally include forming the at least one structure prior to forming the mold material layer.

In Example 15, the subject matter of Example 14 can optionally include forming the at least one structure from the material of the at least one structure being selected from the group consisting of metal, graphene, and sintering paste.

In Example 16, the subject matter of Example 14 can optionally include planarizing the mold material layer to expose a portion of the at least one integrated circuit device.

In Example 17, the subject matter of any of Examples 11 to 13 can optionally include forming the at least one trench in the mold material layer and forming the at least one structure in the at least one trench.

In Example 18, the subject matter of Example 17 can optionally include forming the at least one structure from the material of the at least one structure being selected from the group consisting of metal, graphene, and sintering paste.

In Example 19, the subject matter of Example 17 can optionally include planarizing the mold material layer to expose a portion of the at least one integrated circuit device prior to forming the at least one trench.

In Example 20, the subject matter of any of Examples 11 to 19 can optionally include the least one structure substantially surrounding the at least one integrated circuit device.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit assembly, comprising:
    an electronic substrate;
    at least one integrated circuit device electrically attached to the electronic substrate;
    a mold material layer abutting the electronic substrate and substantially surrounding the at least one integrated circuit device; and
    at least one structure within the mold material layer, wherein the at least one structure comprises a material having a modulus of greater than about 20 gigapascals and a thermal conductivity of greater than about 10 watts per meter-Kelvin.

2. The integrated circuit assembly of claim 1, wherein the material of the at least one structure is selected from the group consisting of metal, graphene, and sintering paste.

3. The integrated circuit assembly of claim 1, wherein the electronic substrate is an active device.

4. The integrated circuit assembly of claim 1, wherein the electronic substrate is a passive device.

5. The integrated circuit assembly of claim 1, wherein the at least one structure substantially surrounds the at least one integrated circuit device.

6. An electronic system, comprising:
    a board;
    an integrated circuit assembly electrically attached to the board, wherein the integrated circuit assembly comprises:
        an electronic substrate;
        at least one integrated circuit device electrically attached to the electronic substrate;
        a mold material layer abutting the electronic substrate and substantially surrounding the at least one integrated circuit device; and
        at least one structure within the mold material layer, wherein the at least one structure comprises a material having a modulus of greater than about 20 gigapascals and a thermal conductivity of greater than about 10 watts per meter-Kelvin.

7. The electronic system of claim 6, wherein the material of the at least one structure is selected from the group consisting of metal, graphene, and sintering paste.

8. The electronic system of claim 6, wherein the electronic substrate is an active device.

9. The electronic system of claim 6, wherein the electronic substrate is a passive device.

10. The electronic system of claim 6, wherein the at least one structure substantially surrounds the at least one integrated circuit device.

11. A method of forming an integrated circuit assembly, comprising:
    forming an electronic substrate;
    forming at least one integrated circuit device;
    electrically attaching the at least one integrated circuit device to the electronic substrate;
    forming a mold material layer to abut the electronic substrate and substantially surrounding the at least one integrated circuit device; and
    forming at least one structure within the mold material layer, wherein the at least one structure comprises a material having a modulus of greater than about 20 gigapascals and a thermal conductivity of greater than about 10 watts per meter-Kelvin.

12. The method of claim 11, wherein forming the electronic substrate comprises forming an active device.

13. The method of claim 11, wherein forming the electronic substrate comprises forming a passive device.

14. The method of claim 11, wherein forming the at least one structure comprises forming the at least one structure prior to forming the mold material layer.

15. The method of claim 14, wherein forming the at least one structure comprises forming the at least one structure from the material selected from the group consisting of metal, graphene, and sintering paste.

16. The method of claim 14, further comprising planarizing the mold material layer to expose a portion of the at least one integrated circuit device.

17. The method of claim 11, wherein forming the at least one structure comprises forming at least one trench in the mold material layer and forming the at least one structure in the at least one trench.

18. The method of claim 17, wherein forming the at least one structure in the at least one trench comprises forming the at least one structure from the material selected from the group consisting of metal, graphene, and sintering paste.

19. The method of claim 17, further comprising planarizing the mold material layer to expose a portion of the at least one integrated circuit device prior to forming the at least one trench.

20. The method of claim 11, wherein forming the at least one structure comprises forming the at least one structure to substantially surround the at least one integrated circuit device.

* * * * *